United States Patent
Watanabe et al.

(10) Patent No.: US 7,450,174 B2
(45) Date of Patent: Nov. 11, 2008

(54) TWO-DIMENSIONAL IMAGE DETECTOR WITH DISTURBANCE-BLOCKING BUFFER

(75) Inventors: Narumi Watanabe, Uji (JP); Toshinori Yoshimuta, Takatsuki (JP)

(73) Assignee: Shimadzu Corporation, Kyoto (JP)

( * ) Notice: Subject to any disclaimer, the term of this patent is extended or adjusted under 35 U.S.C. 154(b) by 660 days.

(21) Appl. No.: 11/079,281

(22) Filed: Mar. 15, 2005

(65) Prior Publication Data

US 2005/0212935 A1 Sep. 29, 2005

(30) Foreign Application Priority Data

Mar. 29, 2004 (JP) .............................. 2004-096206

(51) Int. Cl.
- H04N 5/225 (2006.01)
- H01L 23/34 (2006.01)
- H05K 7/20 (2006.01)

(52) U.S. Cl. ..................... 348/374; 257/717; 361/713

(58) Field of Classification Search ............ 257/E23.08, 257/713, 717; 361/713; 348/374, 300
See application file for complete search history.

(56) References Cited

U.S. PATENT DOCUMENTS

| | | | | |
|---|---|---|---|---|
| 5,175,613 A | * | 12/1992 | Barker et al. ................ 257/713 |
| 5,508,740 A | * | 4/1996 | Miyaguchi et al. .......... 348/244 |
| 6,208,516 B1 | * | 3/2001 | Fangonilo et al. .......... 361/7.13 |
| 2003/0146994 A1 | * | 8/2003 | Kokubun .................... 348/308 |
| 2004/0211908 A1 | * | 10/2004 | Sato et al. .............. 250/370.09 |

* cited by examiner

*Primary Examiner*—Lin Ye
*Assistant Examiner*—Jason Whipkey
(74) *Attorney, Agent, or Firm*—Manabu Kanesaka

(57) ABSTRACT

A two-dimensional image detector includes a sensitive semiconductor layer for converting optical information or radiological information corresponding to a two-dimensional image of a detection subject into electrical charge information; an active matrix substrate for retrieving the electrical charge information converted on the sensitive semiconductor layer; an amplifying electric circuit portion for amplifying the electrical charge information retrieved on the active matrix substrate and converting the electrical charge information into an electrical signal for an image; a disturbance-causing member attached to one side of the amplifying electric circuit portion which may cause a disturbance in the electrical signal. A first disturbance blocking buffer is disposed between the disturbance-causing member and the amplifying electric circuit portion for blocking the disturbance.

9 Claims, 6 Drawing Sheets

TWO-DIMENSIONAL IMAGE DETECTOR WITH DISTURBANCE-BLOCKING BUFFER

BACKGROUND OF THE INVENTION AND RELATED ART STATEMENT

The present invention relates to a two-dimensional image detector in which a sensitive semiconductor layer converts optical information or radiological information corresponding to a two-dimensional image of a detection subject to electrical charge information; an active matrix substrate reads the electrical charge information; and an amplifying electric. circuit portion amplifies the electrical charge information, so that the electrical charge information is converted into an electrical signal for an image. More specifically, the present invention relates to a technology for preventing a disturbance from entering the electrical signal when the amplifying electric circuit portion converts the electrical charge information into the electrical signal for an image.

An X-ray apparatus used in a medical institution such as a hospital is provided with a flat-panel radiation detector (hereinafter abbreviated to "FPD") as a two-dimensional image detector for detecting a transmission X-ray image (two-dimensional image) of a subject (not shown) when X-ray is irradiated on the subject. The FPD has two types, i.e., a direct conversion type in which X-ray is directly converted into electrical charge, and an indirect conversion type in which X-ray is converted into light, and light is converted into electrical charge.

As shown in FIG. 10, the direct conversion type of the FPD includes a sensitive semiconductor layer 51 for converting X-ray information corresponding to a transmission X-ray image of a detection subject into electrical charge information; and an active matrix substrate 52 for retrieving the electrical charge information converted on the sensitive semiconductor layer 51. The sensitive semiconductor layer 51 is formed on the active matrix substrate 52. An electrode 53 is laminated on the sensitive semiconductor layer 51 for applying a bias voltage. When the transmission X-ray image is detected, the transmission X-ray image projected on the sensitive semiconductor layer 51 is converted into the electrical charge on the sensitive semiconductor layer 51, and retrieved on the active matrix substrate 52. Then, the transmission X-ray image projected on the sensitive semiconductor layer 51 is amplified in an amplifying electric circuit portion 54, and converted into an electrical signal for an X-ray picture (for example, refer to Patent Reference 1).

Instead of the electrode 53 for applying a bias voltage, the indirect conversion type of the FPD includes a photoelectric converting layer (not shown) formed on the sensitive semiconductor layer for converting the X-ray information corresponding to the transmission X-ray image of the detection subject into optical information, as well as the sensitive semiconductor layer. The indirect conversion type of the FPD has a structure essentially same as that of the direct conversion type of the FPD, except that the sensitive semiconductor layer converts light converted by the photoelectric converting layer into the electrical charge. Patent Reference 1; Japanese Patent Publication (Kokai) No. 2001-320035

In the direct conversion type and the indirect conversion type of the FPDs, a disturbance tends to enter when the electrical charge information is converted into the electrical signal for an X-ray picture on the amplifying electric circuit portion 54.

An amount of information of the electrical charge (quantity of electrical charge) is extremely small, so that the amplifying electric circuit portion 54 needs to amplify the electrical charge information with a high gain (high amplification rate). In the amplifying electric circuit portion 54 with a high gain, a disturbance is amplified with a high gain along with the electrical charge information. Accordingly, a disturbance inevitably enters when the electrical charge information is converted into the electrical signal. When the disturbance enters the electrical signal for an X-ray picture, a final X-ray picture may have deteriorated quality. Accordingly, it is necessary to prevent a disturbance from entering when the electrical charge information is converted into the electrical signal.

In view of the problems mentioned above, an object of the present invention is to provide a two-dimensional image detector capable of blocking a disturbance when an amplifying electric circuit portion converts electrical charge information into an electrical signal for an image after optical information or radiological information corresponding to a two-dimensional image of a detection subject is converted into the electrical charge information.

Further objects and advantages of the invention will be apparent from the following description of the invention.

SUMMARY OF INVENTION

In order to achieve the objects mentioned above, according to a first aspect of the present invention, a two-dimensional image detector includes a sensitive semiconductor layer for converting optical information or radiological information corresponding to a two-dimensional image of a detection subject into electrical charge information; an active matrix substrate for retrieving the electrical charge information converted on the sensitive semiconductor layer; and an amplifying electric circuit portion for amplifying and converting the electrical charge information retrieved on the active matrix substrate into an electrical signal for an image. A disturbance-causing member, i.e., a factor (disturbance factor) of causing a disturbance in the electrical signal converted on the amplifying electric circuit portions is closely attached to one side of the amplifying electric circuit portion, and a disturbance blocking buffer for blocking the disturbance is sandwiched between the disturbance-causing member and the amplifying electric circuit portion.

In the two-dimensional image detector in the first aspect of the present invention, when the two-dimensional image is detected, the optical information or the radiological information corresponding to the two-dimensional image of the detection subject is converted into the electrical charge information on the sensitive semiconductor layer. Then, the optical information or the radiological information is retrieved on the active matrix substrate, and amplified on the amplifying electric circuit portion to be converted into the electrical signal for an image. In the first aspect, the disturbance blocking buffer is sandwiched between one side of the amplifying electric circuit portion and the disturbance-causing member, so that the disturbance factor of the electrical signal is prevented from entering the amplifying electric circuit portion through the disturbance-causing member closely attached to one side of the amplifying electric circuit portion. Accordingly, when the electrical charge information is converted into the electrical signal for an image on the amplifying electric circuit portion, it is possible to block the disturbance.

According to a second aspect of the present invention, another disturbance blocking buffer is disposed on the other side of the amplifying electric circuit portion opposite to a side wherein the disturbance-causing member is closely attached for blocking the disturbance factor of the electrical signal.

In the two-dimensional image detector in the second aspect of the invention, the another disturbance blocking buffer is disposed on the other side of the amplifying electric circuit portion, and the amplifying electric circuit portion is sandwiched between the disturbance blocking buffers from two sides. Accordingly, it is possible to block the disturbance factor of the electrical signal from the two sides of the amplifying electric circuit portion.

According to a third aspect of the present invention, in the two-dimensional image detector in the second aspect, the disturbance-causing member is an electric-circuit cooling member for cooling the amplifying electric circuit portion. The disturbance blocking buffer on one side of the amplifying electric circuit portion has heat conductance, and the disturbance blocking buffer on the other side of the amplifying electric circuit portion has insulation.

In the two-dimensional image detector in the third aspect of the invention, the disturbance blocking buffer disposed on one side of the amplifying electric circuit portion prevents the disturbance factor of the electrical signal such as a mechanical vibration of the electric-circuit cooling member as the disturbance-causing member from entering the amplifying electric circuit portion. At the same time, the disturbance blocking buffer with the heat conductance on one side of the amplifying electric circuit portion accelerates an outflow of heat generated in the amplifying electric circuit portion. The disturbance blocking buffer with the insulation on the other side of the amplifying electric circuit portion blocks the outflow of heat generated in the amplifying electric circuit portion, so that heat intensively flows into the electric-circuit cooling member without scattering, thereby effectively cooling the amplifying electric circuit portion.

According to a fourth aspect of the present invention, in the two-dimensional image detector in the third aspect, the disturbance blocking buffer on one side of the amplifying electric circuit portion is formed of a heat conducting gel material.

In the two-dimensional image detector in the fourth aspect of the invention, the disturbance blocking buffer formed of the heat conducting gel material is easy to adhere. Accordingly, the heat generated in the amplifying electric circuit portion immediately flows into the cooling member, thereby effectively cooling the amplifying electric circuit portion.

According to a fifth aspect of the present invention, in the two-dimensional image detector in one of the first to fourth aspects, a heat-conductive sheet with non-adhesive is disposed between the disturbance blocking buffer on one side of the amplifying electric circuit portion and the amplifying electric circuit portion. The heat-conductive sheet is non-adhesive relative to the amplifying electric circuit portion.

In the two-dimensional image detector of the invention in the fifth aspect, the heat-conductive sheet with non-adhesive is disposed, so that the disturbance-causing member and the amplifying electric circuit portion are not closely connected. Accordingly, it is easy to dissemble the disturbance-causing member and the amplifying electric circuit portion. It is also easy to repair and inspect the disturbance-causing member and the amplifying electric circuit portion, thereby improving maintenance performance.

In the two-dimensional image detector in the first aspect of the present invention, when the two-dimensional image is detected, the optical information or the radiological information corresponding to the two-dimensional image of the detection subject is converted into the electrical charge information on the sensitive semiconductor layer. Then, the optical information or the radiological information is retrieved on the active matrix substrate, and converted into the electrical signal for an image on the amplifying electric circuit portion. In the first aspect, the disturbance blocking buffer is sandwiched between one side of the amplifying electric circuit portion and the disturbance-causing member, so that the disturbance factor of the electrical signal is prevented from entering the amplifying electric circuit portion through the disturbance-causing member closely attached to one side of the amplifying electric circuit portion. Accordingly, when the electrical charge information is converted into the electrical signal for an image on the amplifying electric circuit portion, it is possible to block the disturbance.

DETAILED DESCRIPTION OF PREFERRED EMBODIMENTS

Hereunder, embodiments of the present invention will be explained with reference to the accompanying drawings.

First Embodiment

Figure 1:
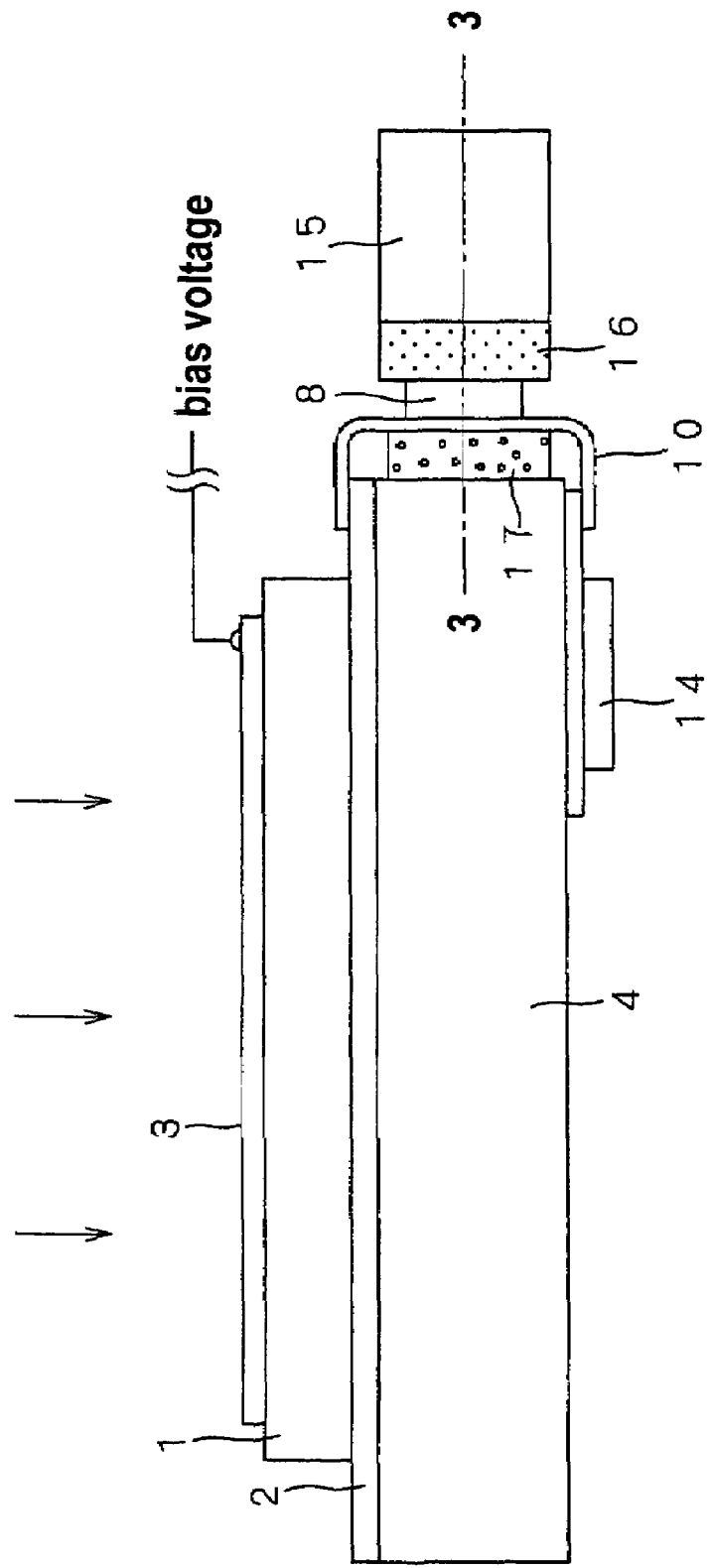
FIG. 1 is a schematic front view showing an overall structure of an FPD according to a first embodiment of the present invention.
Figure 2:
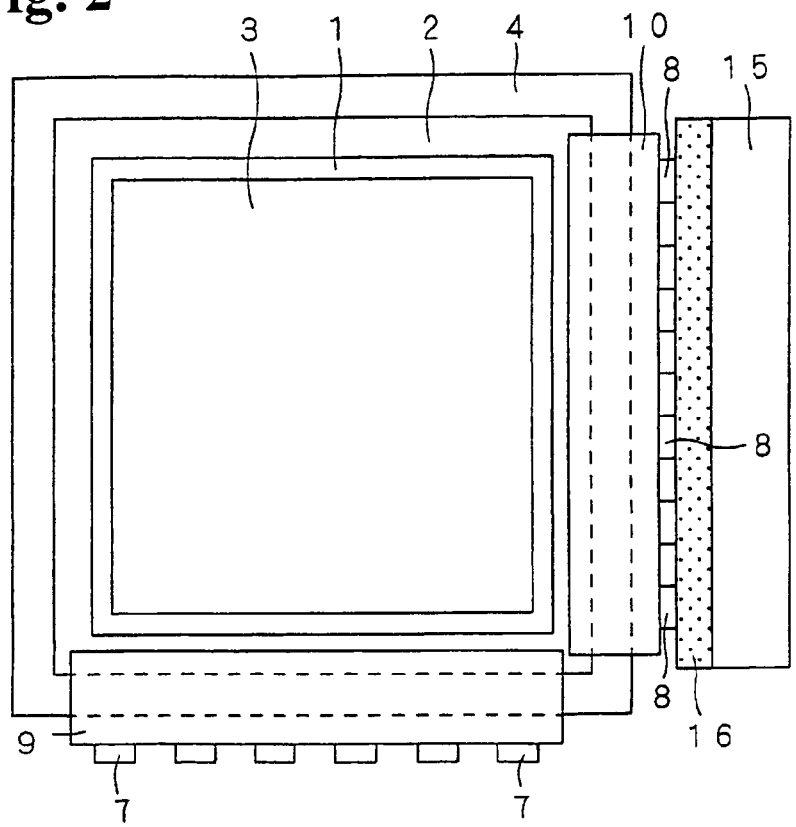
FIG. 2 is a schematic plan view showing the overall structure of the FPD according to the first embodiment.

As a two-dimensional image detector according to a first embodiment of the invention, a flat-panel radiation detector (FPD) of a direct conversion type will be explained in detail with reference to the drawings. FIG. 1 is a front view showing an overall structure of the FPD of the first embodiment; and FIG. 2 is a plan view showing the overall structure of the FPD of the first embodiment. The FPD shown in FIG. 1 is used for detecting a transmission X-ray image in, for example, a medical X-ray imaging device.

As shown in FIG. 1, the FPD includes a sensitive semiconductor layer 1 which converts the radiological information corresponding to the two-dimensional image of the detection subject into the electrical charge information; an active matrix substrate 2 which retrieves the electrical charge information converted on the sensitive semiconductor layer 1; and a common electrode 3 for applying a bias voltage. The sensitive semiconductor layer 1 and the common electrode 3 for applying a bias voltage are mounted on the active matrix substrate 2 on a substrate retentive portion 4. A semiconductor layer such as amorphous selenium (amorphous Se), CdZnTe, CdTe, $HgI_2$, and $PbI_2$ is used for the sensitive semiconductor layer 1.

Figure 4:
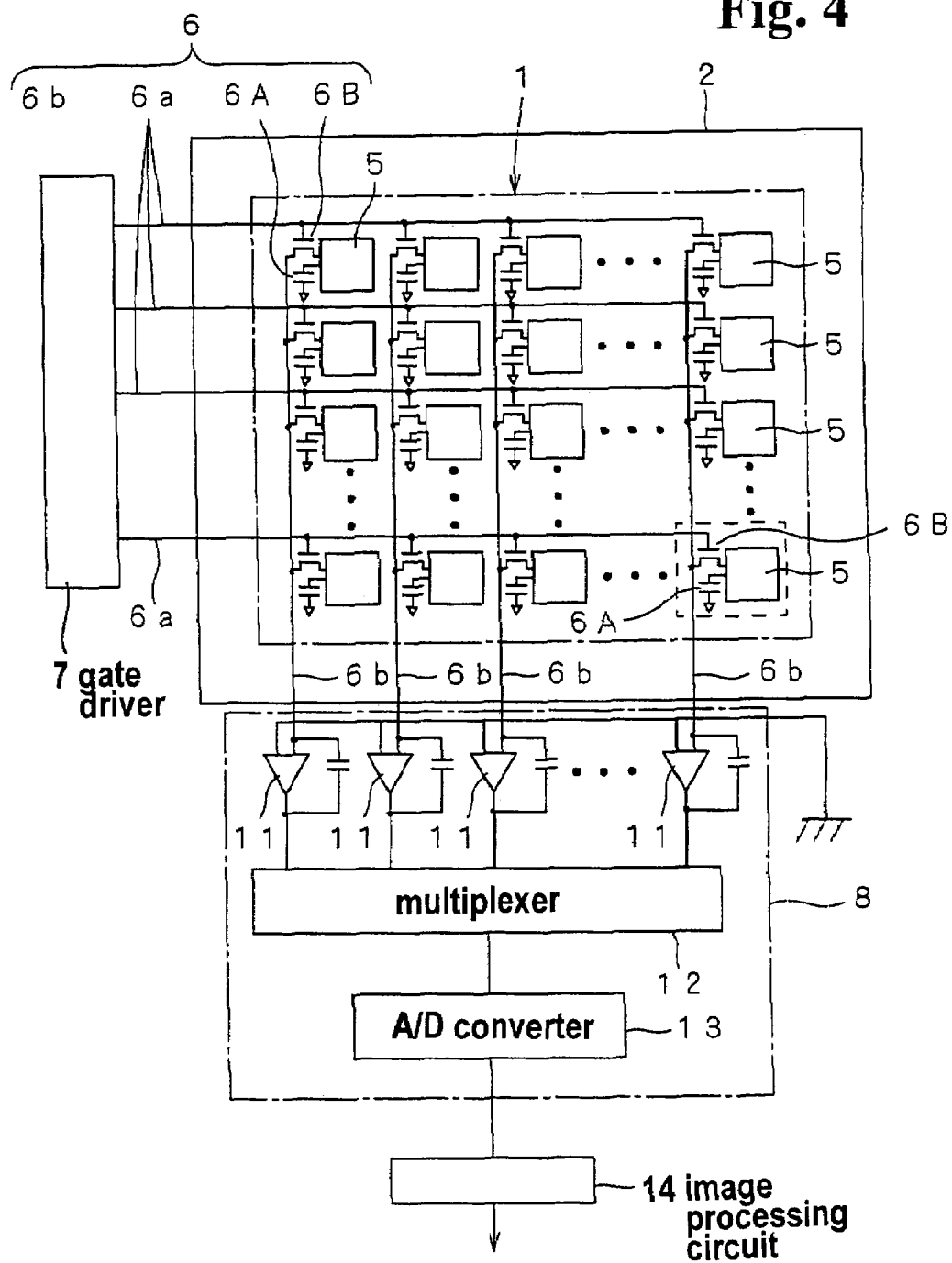
FIG. 4 is a diagram showing a circuit of the FPD according to the first embodiment.
Figure 5:
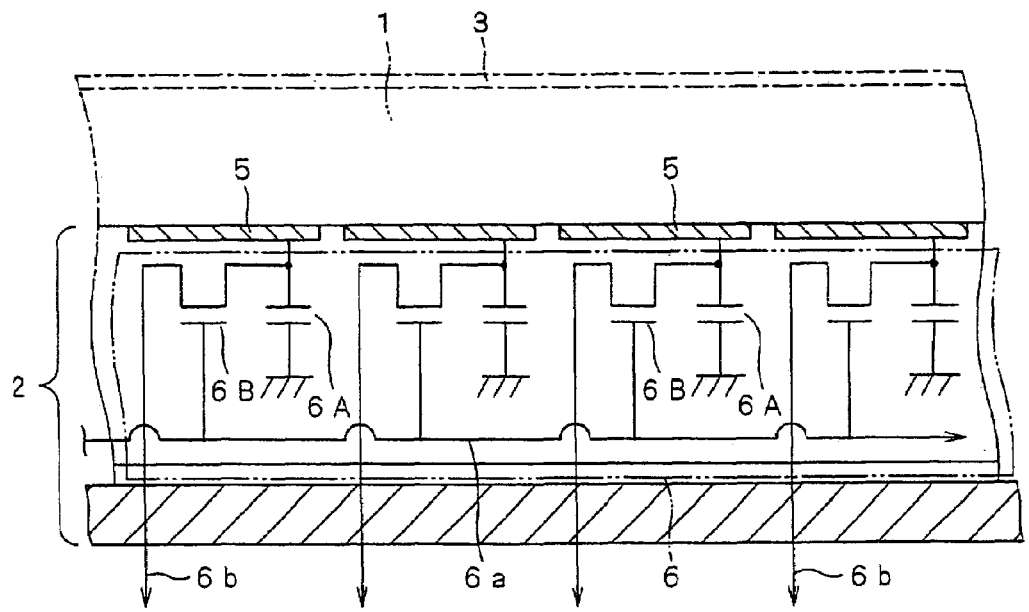
FIG. 5 is a diagram showing a circuit for accumulation and retrieval disposed on an active matrix substrate of the FPD according to the first embodiment.

As shown in FIGS. 4 and 5, in the active matrix substrate 2, a large number of individual electrodes 5 are formed on the surface in a two-dimensional matrix pattern. An electric circuit 6 is provided for accumulating and retrieving an electrical charge collected on each individual electrode 5. At the same time, the sensitive semiconductor layer 1 is formed on a surface where the individual electrodes 5 are formed. In addition, the common electrode 3 is formed on the surface of the sensitive semiconductor layer 1. The electric circuit 6 for accumulating and retrieving the electrical charge is provided on the active matrix substrate 2, and formed of condensers 6A, TFTs (thin film field-effect transistors) 6B as a switching element, and electric wirings 6a and 6b. One condenser 6A and one TFT 6B are provided on each individual electrode 5.

Figure 6:
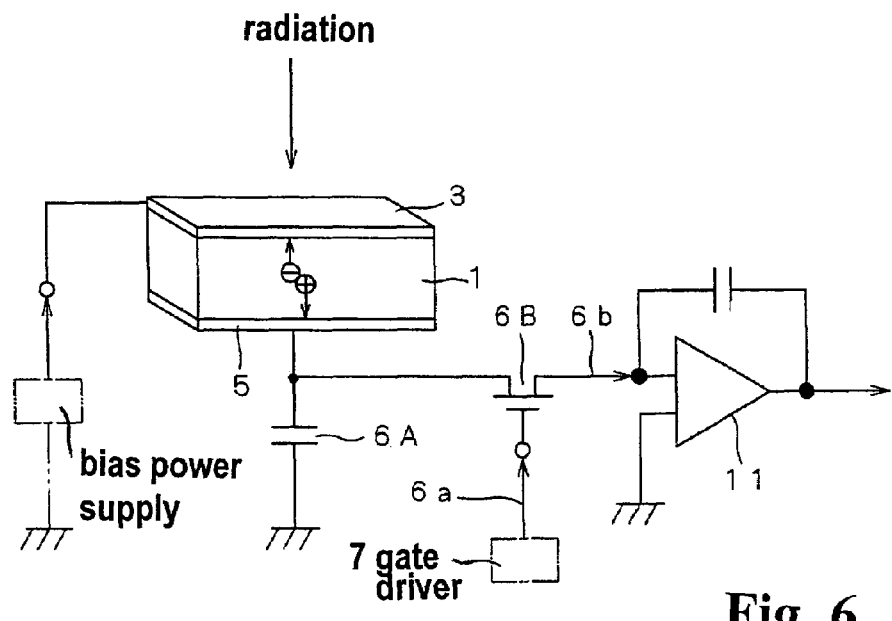
FIG. 6 is a diagram showing a radiation detector unit in the FPD according to the first embodiment.

In the FPD of the first embodiment, each of the electrodes 5 in the two-dimensional matrix pattern is an electrode (picture electrode) corresponding to each pixel. A radiation detector unit (radiation detector element), i.e., an equivalent circuit, shown in FIG. 6 is arranged in a two-dimensional matrix pattern along lattice lines, so that a two-dimensional radiological image projected on the sensitive semiconductor layer 1 is detected.

The FPD of the first embodiment includes gate drivers 7 for controlling the electric circuit 6 for accumulation and retrieval; and amplifying electric circuit portions 8 for amplifying the electrical charge information (detected electrical charge) retrieved by the electric circuit 6 for accumulation and retrieval on the active matrix substrate 2, and exchanging into the electrical signal for an image. Each amplifying electric circuit portion 8 is provided with each of multiple electric wirings 6a and 6b. One of the gate drivers 7 and one of the amplifying electric circuit portions 8 are shown in FIG. 4.

The gate drivers 7 and the amplifying electric circuit portions 8 are mounted in the middle of flexible wiring substrates 9 and 10, respectively. Ends of each flexible wiring substrate 9 and 10 are connectively wired into the surface of the active matrix substrate 2. Other ends of each flexible wiring substrate 9 and 10 are connectively wired into the backside of the substrate retentive portion 4. Each gate driver 7 and each amplifying electric circuit portion 8 are provided on the sides of the active matrix substrate 2 and the substrate retentive portion 4 in a midair-supporting condition.

Each amplifying electric circuit portion 8 has an integrated circuit structure with a multiplexer 12, an A/D converter 13, and electrical-charge and voltage conversion amplifiers 11. The amplifying electric circuit portion 8 may have only the electrical-charge and voltage conversion amplifiers 11. The multiplexer 12 and the A/D converter 13 may be separate members.

The FPD of the first embodiment includes an image processing circuit 14 on the backside of the amplifying electric circuit portion 8 for collecting the electrical signal for an image into a picture signal corresponding to the two-dimensional radiological image of the detection subject. In the present invention, the image processing circuit 14 may be omitted.

When the FPD of the first embodiment detects the two-dimensional radiological image, as shown in FIG. 6, an internal or external bias power supply applies a bias voltage between a few kilovolts and tens of kilovolts to the sensitive semiconductor layer 1 from the common electrode 3 through a lead wire for supplying a bias voltage. The electrical charge is generated in the sensitive semiconductor layer 1 when the two-dimensional image of the detection subject is projected.

At the same time, the electrical charge generated in the sensitive semiconductor layer 1 (specifically, the electrical charge moving to each individual electrode 5 to be induced in each individual electrode 5) is collected in each individual electrode 5. On the other hand, the electrical charge collected in each individual electrode 5 is retrieved as the detected electrical charge per individual electrode 5 by the electric circuit 6 for the accumulation and retrieval on the active matrix substrate 2.

Specifically, a read signal is sent to a gate of each TFT 6B in order via the electric wiring 6a from the gate driver 7. At the same time, the electric wiring 6b connected to a source of each TFT 6B with the read signal is switched the connections to the multiplexer 12 in order. Accordingly, the electrical charges accumulated in the condensers 6A are amplified in the electrical-charge and voltage conversion amplifiers 11 via the electric wiring 6b from the TFT 6B, and then sent to the A/D converter 13 as a radiological detection signal per each individual electrode 5 by the multiplexer 12 to be digitized.

Figure 3:
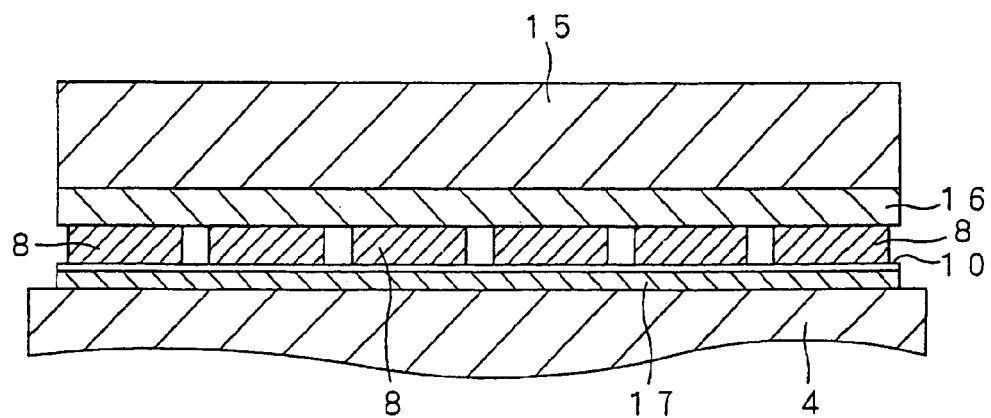
FIG. 3 is a cross sectional view showing a main portion of amplifying electric circuit portions of the FPD according to the first embodiment.

In the FPD of the first embodiment, as shown in FIGS. 1 to 3, a cooling system 15 is attached to the outer side (one side) of the amplifying electric circuit portions 8 (electric-circuit cooling member as the disturbance-causing member), and a disturbance blocking buffer 16 made of a heat-conductive silicone gel is placed between the cooling system 15 and the amplifying electric circuit portions 8. A disturbance blocking buffer 17 made of insulating silicone is placed on the inner side (other side) of the amplifying electric circuit portions 8, and sandwiched between the amplifying electric circuit portions 8 and the substrate retentive portion 4. In addition, FIG. 3 is a cross sectional view showing a main portion of the amplifying electric circuit portions of the FPD of the first embodiment taken along line 3-3 in FIG. 1.

For the cooling system 15, a water-cooled cooler or an air-cooled cooler can be used. A natural-cooling cooler simply made of a cooling fan can be also used.

The disturbance blocking buffer 16 and the disturbance blocking buffer 17 are vibration absorption members with a cushion function for preventing mechanical vibrations of the disturbance factors causing the disturbance in the electrical signal converted in the amplifying electric circuit portions 8 from entering the electric circuit portions 8. A thickness of the disturbance blocking buffer 16 is usually between 1 mm and 5 mm, and a thickness of the disturbance blocking buffer 17 is usually between 0.3 mm and 3 mm.

In the FPD of the first embodiment, during the detection of the two-dimensional radiological image, the detected electrical charges are amplified in the amplifying electric circuit portions 8 and converted into the electrical signals for an image. At the same time, the disturbance blocking buffer 16 sandwiched between the outer side of the amplifying electric circuit portions 8 and the cooling system 15 prevents the mechanical vibrations of the disturbance factors of the electrical signals from the cooling system 15 attached to the outer part of the amplifying electric circuit portions 8. As a result, when the detected electrical charges are converted into the electrical signals for an image in the amplifying electric circuit portions 8, the disturbance can be blocked.

In addition, in the FPD of the first embodiment, the disturbance blocking buffer 17 is placed on the inner side of the amplifying electric circuit portions 8, and the amplifying electric circuit portions 8 are sandwiched between the disturbance blocking buffers 16 and 17 from the outer side and the inner side. The disturbance blocking buffers 16 and 17 block transmission of the disturbance factors of the electrical signals, so that the amplifying electric circuit portions 8 on both the outer side and the inner side are blocked from the interfusion of the disturbance.

In other words, in the FPD of the first embodiment, since the amount of the electrical charge information (amount of the electrical charge) which is an amplifying subject of the amplifying electric circuit portions 8 is extremely small, the amplifying electric circuit portions 8 become high gain circuits. However, there are no disturbance factors of the electrical signal due to the disturbance blocking buffers 16 and 17, so that the amplifying electric circuit portions 8 can prevent the interfusion of the disturbance even though the amplifying electric circuit portions 8 are high gain circuits.

In addition, the outflow of the heat generated in the amplifying electric circuit portions 8 is accelerated at the disturbance blocking buffer 16 with heat conductance on the outer side of the amplifying electric circuit portions 8. On the inner side of the amplifying electric circuit portions 8, the outflow of the heat generated in the amplifying electric circuit portions 8 is blocked by the disturbance blocking buffer 17 with insulation, so that heat generated in the amplifying electric circuit portions 8 intensively flows into the cooling system 15 without escaping. As a result, the cooling of the amplifying electric circuit portions 8 is carried out without a hitch.

Also, since the disturbance blocking buffer 16 made of the heat conducting gel material excels in adhesiveness, the heat generated in the amplifying electric circuit portions 8 immediately flows into the cooling system 15. As a result, the cooling of the amplifying electric circuit portions 8 is accelerated.

Second Embodiment

Figure 7:
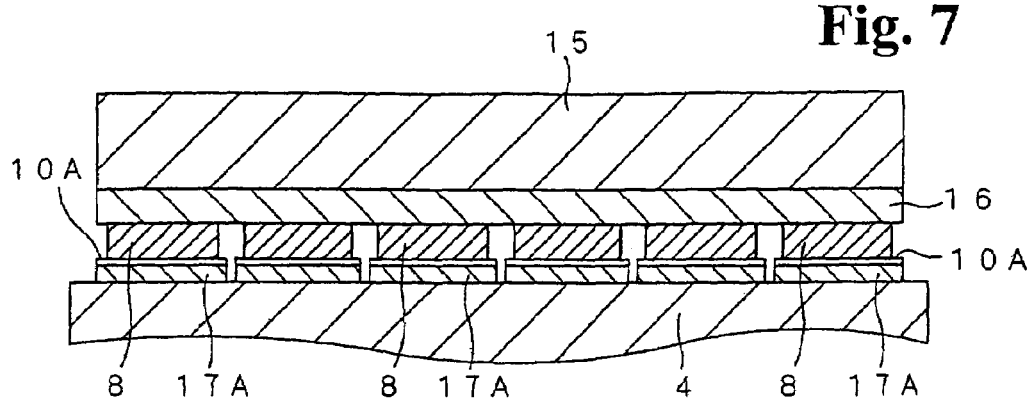
FIG. 7 is a cross sectional view showing a portion of amplifying electric circuit portions of an FPD according to a second embodiment of the present invention.

An FPD of the second embodiment will be explained with reference to the drawings. FIG. 7 is a cross sectional view showing a main portion of the amplifying electric circuit portions 8 of the FPD of the second embodiment.

As shown in FIG. 7, the FPD of the second embodiment is placed on the inner side of the amplifying electric circuit portions 8. The FPD of the first embodiment has a sheet of flexible wiring substrate 10 and a sheet of disturbance blocking buffer 17. In the FPD of the second embodiment, flexible wiring substrates 10A and disturbance blocking buffers 17A are separately placed on each amplifying electric circuit portion 8. Other parts of the FPD of the second embodiment have substantively the same structures as those of the FPD of the first embodiment, and an effect of the FPD of the second embodiment is the same as the effect of the FPD of the first embodiment except that each amplifying electric circuit portion 8 can be separately mounted and replaced. Therefore, any other explanation is omitted.

Third Embodiment

Figure 8:
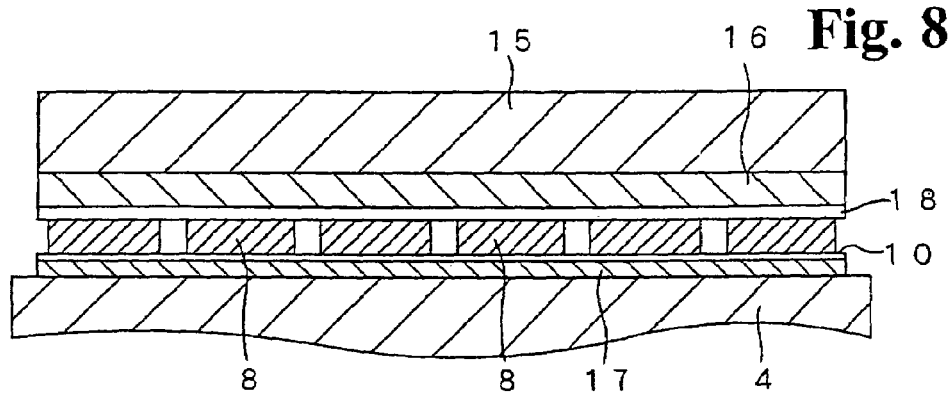
FIG. 8 is a cross sectional view showing a portion of amplifying electric circuit-portions of an FPD according to a third embodiment of the present invention.

An FPD of the third embodiment will be explained with reference to the drawings. FIG. 8 is a cross sectional view showing a main portion of the amplifying electric circuit portions 8 of the FPD of the third embodiment.

In the FPD of the third embodiment, a heat-conductive sheet 18 which is non-adhesive with respect to the amplifying electric circuit portions 8 is placed between the disturbance blocking buffer 16 of the outer side of the amplifying electric circuit portions 8 and the amplifying electric circuit portions 8. The other effect of the FPD of the third embodiment is the same as that of the FPD of the first embodiment. Therefore, the explanation is omitted except for differences.

According to the FPD of the third embodiment, since the connection between the amplifying electric circuit portions 8 and the disturbance blocking buffer 16 can be prevented due to the interposition of the heat-conductive sheet 18 which is non-adhesive, the cooling system 15 or the amplifying electric circuit portions 8 can be easily dismantled, and the repair and inspection of the cooling system 15 or the amplifying electric circuit portions 8 become easier. As a result, maintenance performance can be increased. For the heat-conductive sheet 18, for example, a silicone rubber sheet with a thickness between 0.2 mm and 1 mm can be used.

Fourth Embodiment

Figure 9:
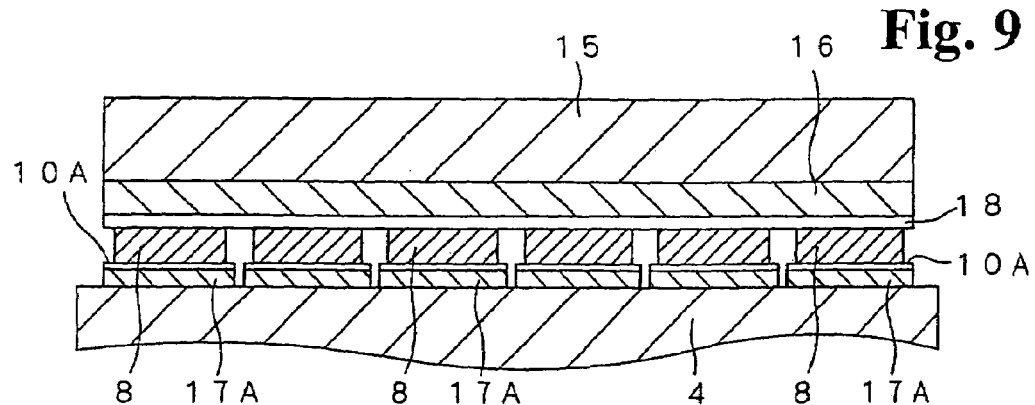
FIG. 9 is a cross sectional view showing a portion of amplifying electric circuit portions of an FPD according to a fourth embodiment of the present invention.
Figure 10:
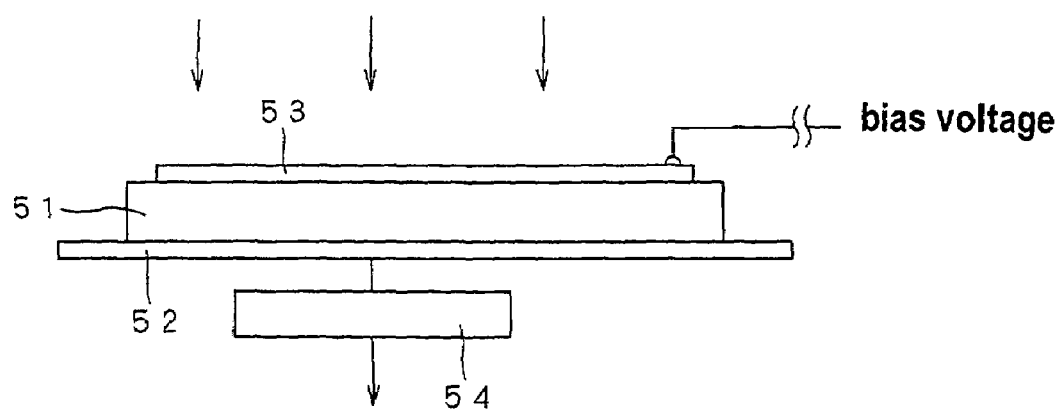
FIG. 10 is a diagram showing a substantial structure of a conventional FPD.

An FPD of the fourth embodiment will be explained with reference to the drawings. FIG. 9 is a cross sectional view showing a main portion of the amplifying electric circuit portions 8 of the FPD of the fourth embodiment.

As shown in FIG. 9, in the FPD of the fourth embodiment, the FPD of the fourth embodiment is placed on the inner side of the amplifying electric circuit portions 8. The FPD of the third embodiment has a sheet of flexible wiring substrate 10 and a sheet of disturbance blocking buffer 17. In the FPD of the fourth embodiment, the flexible wiring substrates 10A and the disturbance blocking buffers 17A are separately placed on each amplifying electric circuit portion 8. Other parts of the FPD of the fourth embodiment have substantively the same structures as those of the FPD of the third embodiment, and an effect of the FPD of the fourth embodiment is the same as the effect of the FPD of the third embodiment except that each amplifying electric circuit portion 8 can be separately mounted and replaced. Therefore, the explanation is omitted.

The invention is not limited to the embodiments described hereinabove, and can be modified as follows.

(1) The FPD in one of the embodiments is a direct conversion type. The present invention can be applied to the FPD with the indirect conversion type which once converts incident radiation into a light, and then converts the converted light into the electrical charge.

(2) The disturbance blocking buffers 16 and 17 and the heat-conductive sheet 18 of the FPD in the embodiments are not limited to the materials described hereinabove.

(3) In the embodiments, the gate drivers 7 and the amplifying electric circuit portions 8 are mounted by each per a number of electric wirings 6a and 6b, and divided into a number of devices. As a modified embodiment, the gate drivers 7 or the amplifying electric circuit portions 8 may be collected into a single device with respect to all the electric wirings 6a and 6b.

(4) In the embodiments, the two-dimensional image of the detection subject is the radiological image. In the present invention, the two-dimensional image of the detection subject is not limited to the radiological image, and an optical image is also included in the two-dimensional image of the detection subject.

(5) The FPD in one of the embodiments is used for medical purposes. The two-dimensional image detector of the invention is not limited to the medical purposes, and can be used for industrial or nuclear energy purposes.

The disclosure of Japanese Patent Application No. 2004-096206, filed on Mar. 29, 2004, is incorporated in the application.

While the invention has been explained with reference to the specific embodiments of the invention, the explanation is illustrative and the invention is limited only by the appended claims.

What is claimed is:

1. A two-dimensional image detector, comprising:
   a sensitive semiconductor layer for converting optical information or radiological information corresponding to a two-dimensional image of a detection subject into electrical charge information,
   an active matrix substrate attached to the sensitive semiconductor layer for retrieving the electrical charge information converted on the sensitive semiconductor layer,
   an amplifying electric circuit portion electrically connected to the active matrix substrate for amplifying the electrical charge information retrieved on the active matrix substrate, said amplifying electric circuit portion converting the electrical charge information into an electrical signal for an image,
   a cooling system as a disturbance-causing member attached to the amplifying electric circuit portion, said cooling system generating mechanical vibrations as a disturbance, and
   a first disturbance blocking buffer disposed between the disturbance-causing member and the amplifying electric circuit portion for preventing the mechanical vibrations as the disturbance from entering the electrical signal.

2. A two-dimensional image detector according to claim 1, further comprising a second disturbance blocking buffer disposed on a side of the amplifying electric circuit portion opposite to the first disturbance blocking buffer for preventing the disturbance from entering the electrical signal.

3. A two-dimensional image detector according to claim 1, wherein said cooling system is a water-cooled cooler.

4. A two-dimensional image detector comprising:
   a sensitive semiconductor layer for converting optical information or radiological information corresponding to a two-dimensional image of a detection subject into electrical charge information,
   an active matrix substrate attached to the sensitive semiconductor layer for retrieving the electrical charge information converted on the sensitive semiconductor layer,
   an amplifying electric circuit portion electrically connected to the active matrix substrate for amplifying the electrical charge information retrieved on the active matrix substrate, said amplifying electric circuit portion converting the electrical charge information into an electrical signal for an image,
   a disturbance-causing member attached to the amplifying electric circuit portion, said disturbance-causing member generating a disturbance,
   a first disturbance blocking buffer disposed between the disturbance-causing member and the amplifying electric circuit portion for preventing the disturbance from entering the electrical signal, and
   a second disturbance blocking buffer disposed on a side of the amplifying electric circuit portion opposite to the first disturbance blocking buffer for preventing the disturbance from entering the electrical signal,
   wherein said disturbance-causing member includes an electric-circuit cooling member for cooling the amplifying electric circuit portion, said first disturbance blocking buffer being formed of a heat conductive material and said second disturbance blocking buffer being formed of a heat insulating material.

5. A two-dimensional image detector according to claim 4, wherein said first disturbance blocking buffer is formed of a heat conducting gel material.

6. A two-dimensional image detector according to claim 4, further comprising one or more heat-conductive sheets disposed between the first disturbance blocking buffer and the amplifying electric circuit portion, said heat-conductive sheets being non-adhesive relative to the amplifying electric circuit portion.

7. A two-dimensional image detector according to claim 4, further comprising a wiring substrate for connecting the active matrix substrate to the amplifying electric circuit portion, said wiring substrate being partly sandwiched between the second disturbance blocking buffer and the amplifying electric circuit portion.

8. A two-dimensional image detector according to claim 7, further comprising a substrate retentive portion situated under the active matrix substrate, said second disturbance blocking buffer being attached to the substrate retentive portion.

9. A two-dimensional image detector comprising:
   a sensitive semiconductor layer for converting optical information or radiological information corresponding to a two-dimensional image of a detection subject into electrical charge information,
   an active matrix substrate attached to the sensitive semiconductor layer for retrieving the electrical charge information converted on the sensitive semiconductor layer,
   an amplifying electric circuit portion electrically connected to the active matrix substrate for amplifying the electrical charge information retrieved on the active matrix substrate, said amplifying electric circuit portion converting the electrical charge information into an electrical signal for an image,
   a disturbance-causing member attached to the amplifying electric circuit portion, said disturbance-causing member generating a disturbance,
   a first disturbance blocking buffer disposed between the disturbance-causing member and the amplifying electric circuit portion for preventing the disturbance from entering the electrical signal, and
   a second disturbance blocking buffer disposed on a side of the amplifying electric circuit portion opposite to the first disturbance blocking buffer for preventing the disturbance from entering the electrical signal,
   wherein said amplifying electric circuit portion is formed of a plurality of circuit sections, and said second disturbance blocking buffer is formed of a plurality of buffer sections attached to the respective circuit sections.

* * * * *